(12) United States Patent
Van Veenhuizen

(10) Patent No.: US 8,907,491 B2
(45) Date of Patent: Dec. 9, 2014

(54) PITCH QUARTERING TO CREATE PITCH HALVED TRENCHES AND PITCH HALVED AIR GAPS

(71) Applicant: Intel Corporation, Santa Clara, CA (US)

(72) Inventor: Marc Van Veenhuizen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/630,712

(22) Filed: Sep. 28, 2012

(65) Prior Publication Data

US 2014/0091466 A1   Apr. 3, 2014

(51) Int. Cl.
*H01L 23/48*   (2006.01)

(52) U.S. Cl.
USPC .......................................... 257/774; 438/700

(58) Field of Classification Search
USPC .......................................... 257/774; 438/700
See application file for complete search history.

(56) References Cited

U.S. PATENT DOCUMENTS

2010/0133699 A1\*   6/2010   Werner et al. ................. 257/774
2012/0205810 A1\*   8/2012   Kim ............................. 257/773

\* cited by examiner

*Primary Examiner* — David Vu
*Assistant Examiner* — Brandon Fox
(74) *Attorney, Agent, or Firm* — Forefront IP Lawgroup, PLLC

(57) ABSTRACT

A silicon structure is fabricated determining a pattern for wire trenches and air gaps. The wire trenches are created, and certain trenches are used as air gaps. The remaining wire trenches are used for metallization of inter connecting wires.

19 Claims, 13 Drawing Sheets

US 8,907,491 B2

PITCH QUARTERING TO CREATE PITCH HALVED TRENCHES AND PITCH HALVED AIR GAPS

BACKGROUND

In fabrication of semiconductor components and devices, as sizes of the components and devices decrease, challenges increase. In particular, pitch size of interconnecting lines and gaps of components and devices are evolving from 18 nanometers (nm) to sub 14 nm half-pitch size, creating smaller or tighter pitch metal trenches used for wire connections. A problem with smaller/tighter pitch sizes is the introduction of capacitive coupling between interconnecting lines. A solution to address capacitive coupling is to remove or relocate an interconnecting line. Another solution is to provide air gaps between interconnecting lines.

Fabrication of semiconductor components and devices includes indirect patterning or lithographic methods; however, it is a challenge to create air gaps using indirect patterning or lithography. It further becomes more of challenge when designs use interlayer dielectric (ILD) structures. In particular, as components and devices become smaller, the challenge increases as to providing such air gaps using indirect patterning or lithographic methods.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein are techniques and structures that provide air gap (AG) formation between interconnect trenches obtained by a pitch division scheme, thereby reducing the capacitive coupling between tight pitch trenches. Air gaps may be achieved by pitch division of an order higher needed for a design (wire pattern) to create a desired pitch. A number (e.g., a maximum number being half of the air gaps) of the extra created trenches may be used as air gaps. In certain implementations, the use of one or more interlayer dielectric structures or ILDs may be used. For example, there may be an ILD/AG/ILD layered arrangement implementing an interconnect pattern of tight-pitch (e.g., a sub 18 nm half-pitch) metal trenches. Implementations may combine metal trench and air gap formation with only one pass through lithography. Plug patterning may be used to precisely control what becomes air gap. Furthermore, there may be high flexibility in defining the trench width, air gap width, and ILD sidewall width independently.

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Pitch quartering is a technique that uses two consecutive indirect patterning processes. A process is performed to define a backbone-1 (BB1) trench profile. A conformal spacer is then deposited. The spacer creates additional trenches between the existing numbers of trenches, effectively doubling the number of trenches. Pitch quartering turns one trench into four smaller size trenches. A method that may be used is optical lithography. The techniques involved in pitch quartering are further described below.

Figure 1:
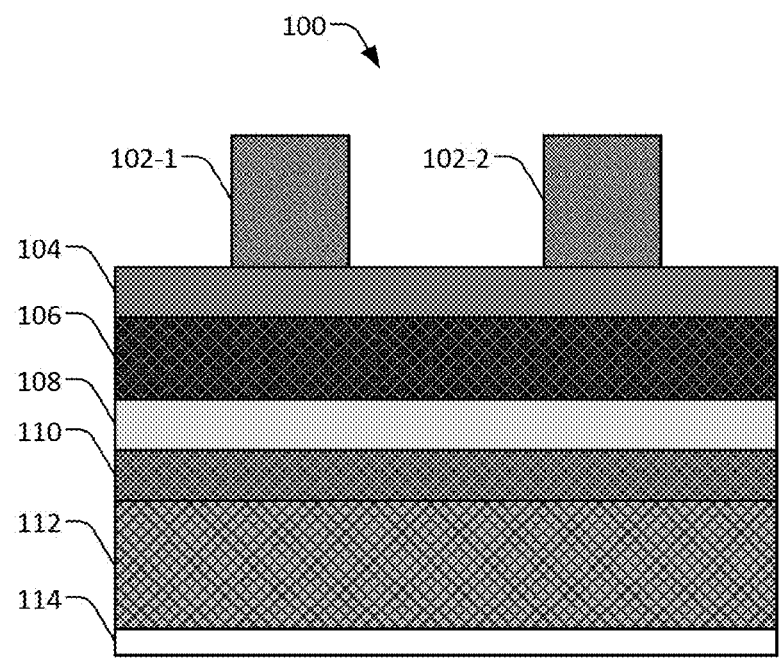
FIG. 1 is a diagram illustrating an example cross section of a structure of a backbone-1 (BB1) definition process.

FIG. 1 shows a cross section of a backbone structure 100 that may be performed using a lithography process. The structure 100 may include one or more raised backbone-1 (BB1) structures 102, an anti-reflective coating (ARC) layer 104, a material layer (e.g., carbon hard mask or CHM) 106 into which a backbone-2 (BB2) profile will be defined, a hardmask-2, HM2 (e.g., silicon nitride or SiN and the like materials) layer 108, a hardmask-1, HM1 (e.g., titanium nitride or TiN and the like materials) layer 110, an interlayer dielectric (ILD) layer 112, and a previous metal layer 114. The structure 100 may be created using one or more several known techniques including lithography. The structure 100 is used as a building block for conformal spacer-1 deposition, and may start off with a relatively large pitch, such as 136 nm. The pitch size of the starting BB1 pattern may eventually be reduced by a factor of four (i.e., pitch quartering).

Figure 2:
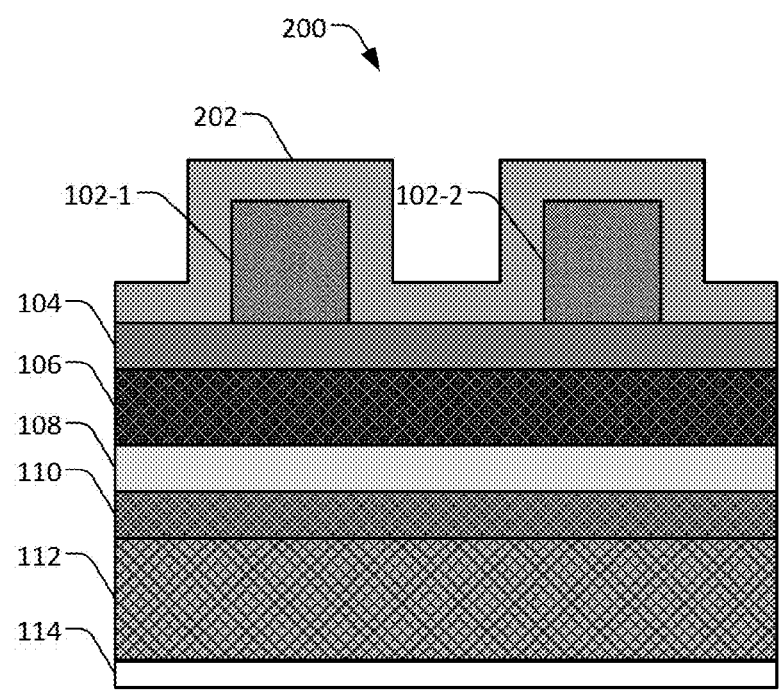
FIG. 2 is a diagram illustrating an example cross section of a structure of a spacer-1 deposition process.

FIG. 2 is a cross section of a structure 200 with a spacer-1 deposition using chemical vapor deposition (CVD) or atomic layer deposition (ALD). A conformal spacer 202 may be applied. The conformal spacer 202 wraps around the BB1 102 of structure 100, following the shape of BB1 102.

Figure 3:
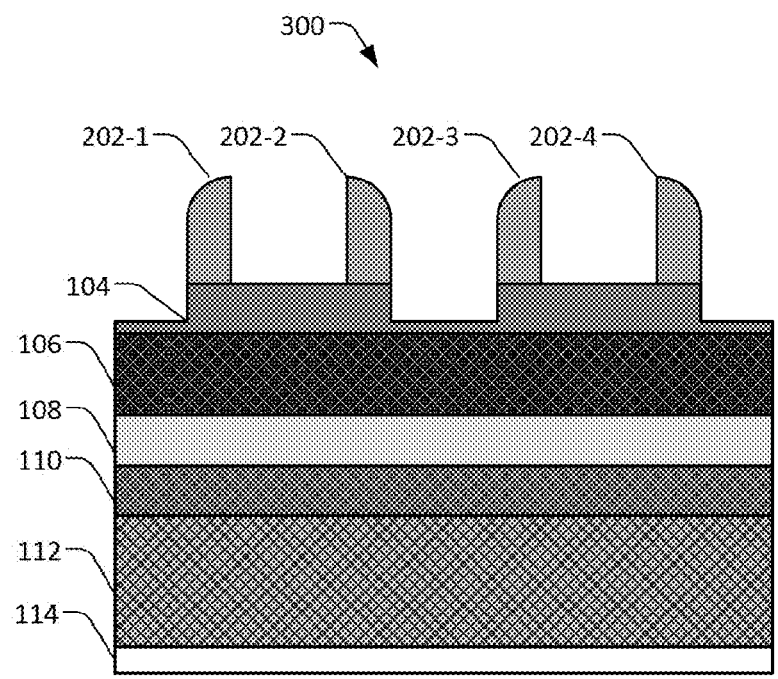
FIG. 3 is a diagram illustrating an example cross section of a structure of a spacer-1 etch and a backbone-1 (BB1) definition removal process.

FIG. 3 is a cross section of a structure 300 using dry etching technique is applied to form sidewall spacers 202 and removed the BB1 102 creating additional trenches.

Figure 4:
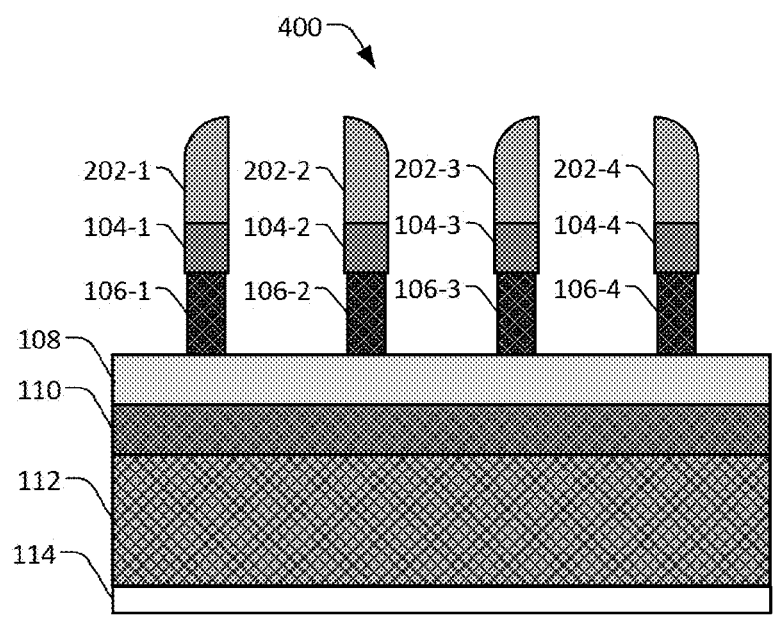
FIG. 4 is a diagram illustrating an example cross section of a structure of a backbone-2 (BB2) definition etch process.

FIG. 4 is a cross section of a structure 400 using dry etching technique, and using the remaining sidewall spacers 202 as mask, the material layer 106 is etched. This etching effectively transfers the wire pattern into the backbone-2 (BB2) 106.

Figure 5:
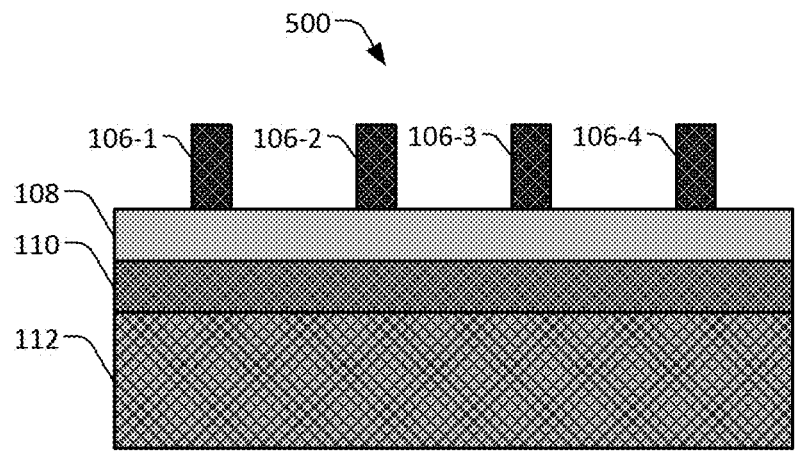
FIG. 5 is a diagram illustrating an example cross section of a structure of a wet cleanse process.

FIG. 5 is a cross section of a structure 500 using a wet cleanse process. The wet cleanse removes the remaining spacer-1 or sidewall spacers 202 and ARC material layer 104 on top of BB2 106 refer to FIG. 4.

Figure 6:
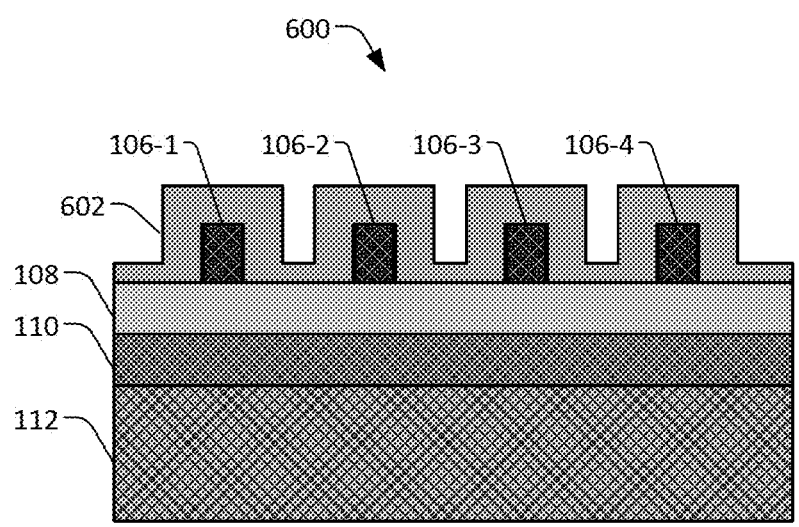
FIG. 6 is a diagram illustrating an example cross section of a structure of a spacer-2 deposition process.

FIG. 6 is a cross section of a structure 600 with a spacer-2 deposition, using CVD or ALD deposition technique. A conformal spacer 602 with has a different etch characteristic from HM1 and HM2 may be applied. Spacer-2 or the conformal spacer 602 wraps around the BB2 106 of structure 600, following the shape of the BB2 106.

Figure 7:
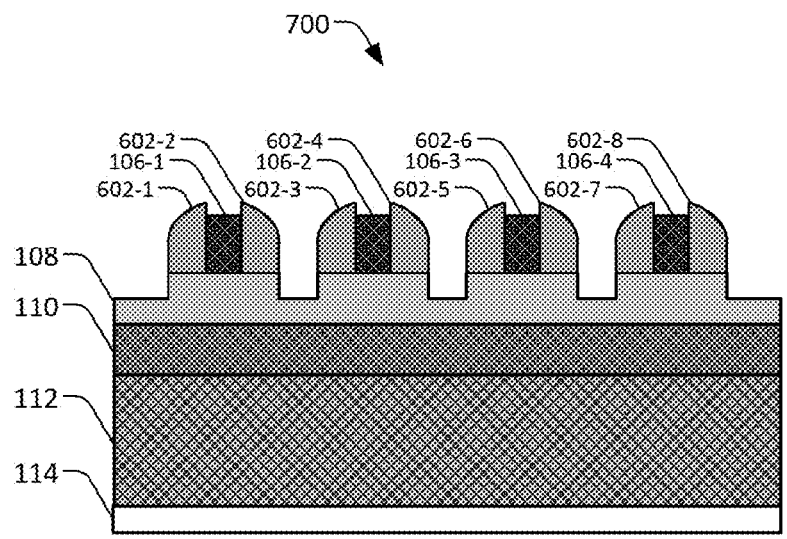
FIG. 7 is a diagram illustrating an example cross section of a structure of a spacer-2 etch process.

FIG. 7 is a cross section of a structure 700, using dry etching technique, the conformal spacer-2 602 on top of BB2 106, refer to FIG. 6, is etched to form sidewall spacers 602. It is contemplated that the partially etched HM2 in FIG. 7 may serve to provide a robust process to prevent against over etches. Therefore, additional trenches may be created between the remaining conformal spacer-2 material 602 adjacent to BB2 106 that are in total four times more numerous than the number of trenches of the original backbone-1 structure 100 of FIG. 1. Therefore, the pattern is considered "pitch quartered."

Figure 8:
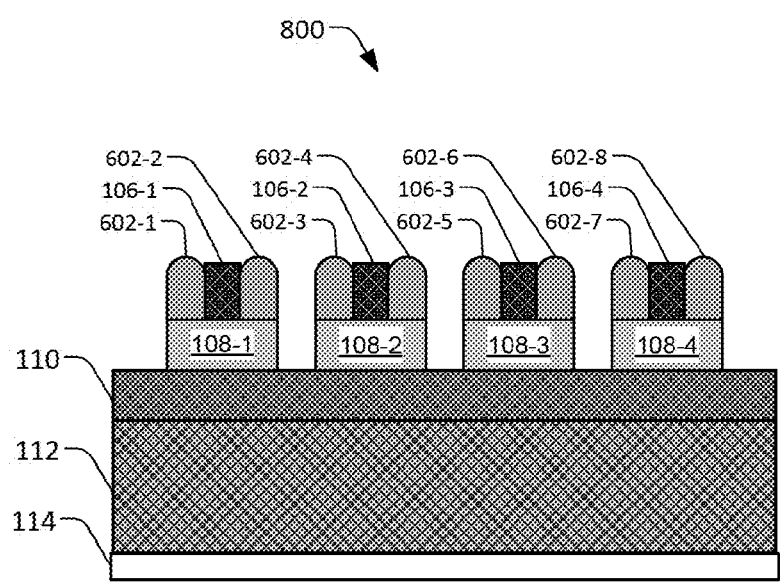
FIG. 8 is a diagram illustrating an example cross section of a structure of a hardmask-2 (HM2) etch process.

FIG. 8 is a cross section of a structure 800, using dry etching technique, HM2 material layer 108 is etched while BB2 106 is used as hard mask or an etch mask. The exposed HM2 layer 108 is now fully etched, refer to FIG. 7. If BB2 106 would have been removed before this HM2 material layer 108 etch, the pitch quartered trench profile would have been completely transferred into HM2 material layer 108. By leaving BB2 106 in place during this HM2 material layer 108 etch, only half of the pitch quartered trenches is being transferred into HM2 material layer 108, the other half being protected by the BB2 106 material during the etch process. The transferred trenches form the subset of trenches from which the ones will be selected (by plug-lithography, as described in FIG. 10) that will be used as air-gaps.

Figure 9:
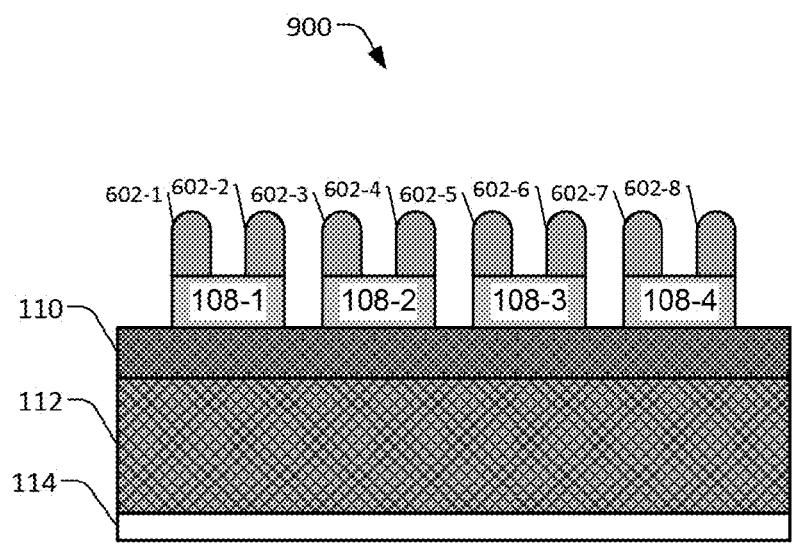
FIG. 9 is a diagram illustrating an example cross section of a structure of a backbone-2 (BB2) removal process.

FIG. 9 is a cross section of a structure 900 using dry etch or ash process, the BB2 106 material is removed while the sidewall spacers 602 remains.

Figure 10:
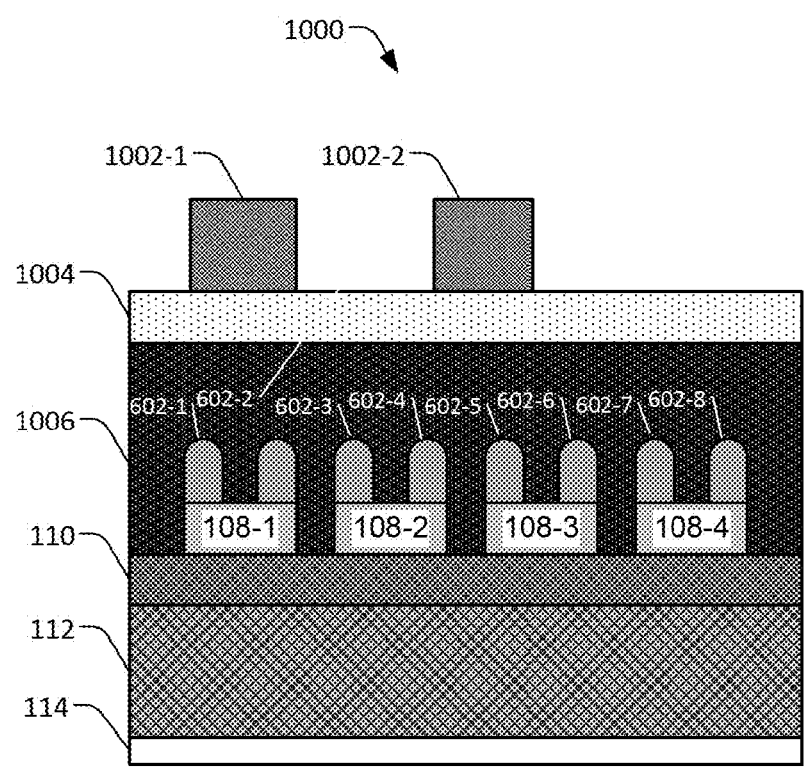
FIG. 10 is a diagram illustrating an example cross section of a structure of a plug lithography process.

FIG. 10 is a cross section of a structure 1000 using a plug lithography process. Additional structures, pattern 1002, ARC 1004, and CHM 1006 are introduced, using spin coating technique. The plug lithography process may be used to cut wires, providing for straight wire ends. In addition, the plug lithography process may be used to determine which of the subset of trenches defined into HM2 layer 108 will become air gaps or instead metal trenches for interconnecting wires. That is, trenches from this subset that are plugged will end up as interconnect wires and not as air gaps.

Figure 11:
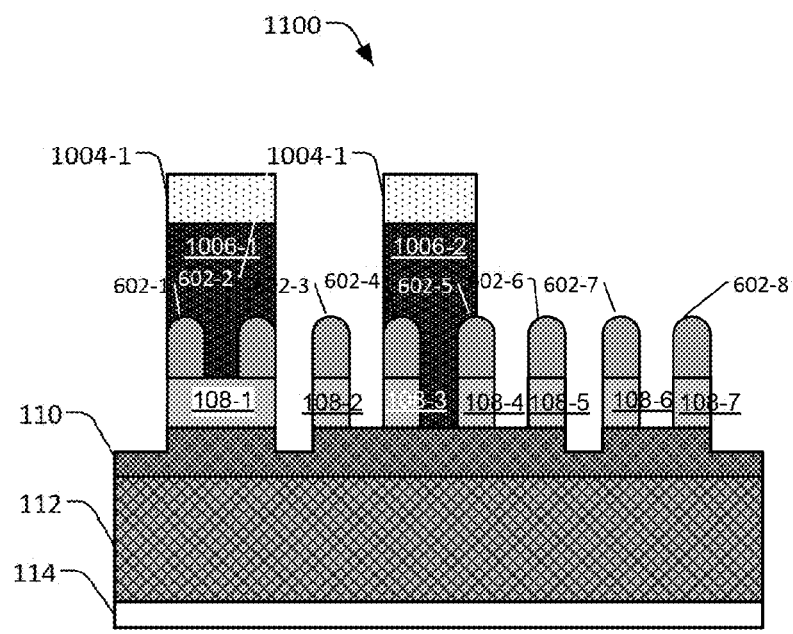
FIG. 11 is a diagram illustrating an example cross section of a structure of a sequential plug-litho etch, hardmask-1 (HM1) partial etch, and hardmask-2 (HM2) etch process.

FIG. 11 is a cross section of a structure 1100 using dry etching technique, HM1 layer 110 is etched partially with subsequent HM2 layer 108 etch. The right plug 1006-2 blocks the HM1 layer 110 etch and as will be seen later prevents the creation of an air gap below.

Figure 12:
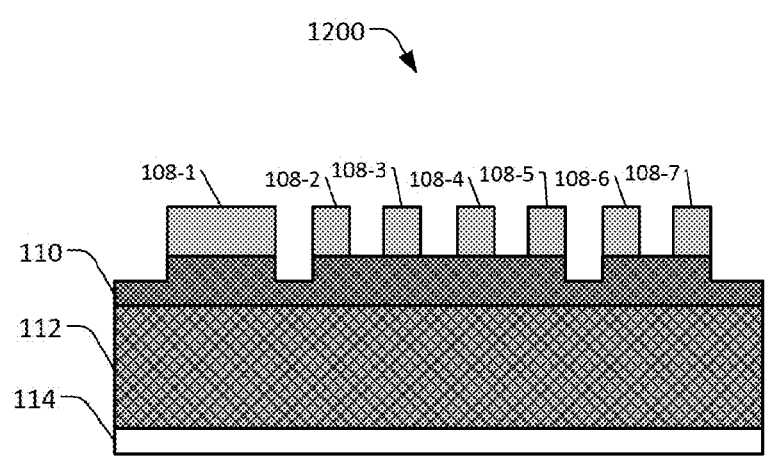
FIG. 12 is a diagram illustrating an example cross section of a structure of a wet cleanse process.

FIG. 12 is a cross section of a structure 1200 using a wet cleanse process, the cleanse process removes all plug lithography and spacer-2 or the conformal spacer 602 material but leaves in place the HM2 layer 108 and HM1 layer 110 (see FIG. 11). Therefore there is a pattern with both HM2 layer 108 and HM1 layer 110, with air gaps into the HM1 layer 110. The partially etched HM1 layer 110 still protects the ILD layer 112 during this wet cleanse process.

Figure 13:
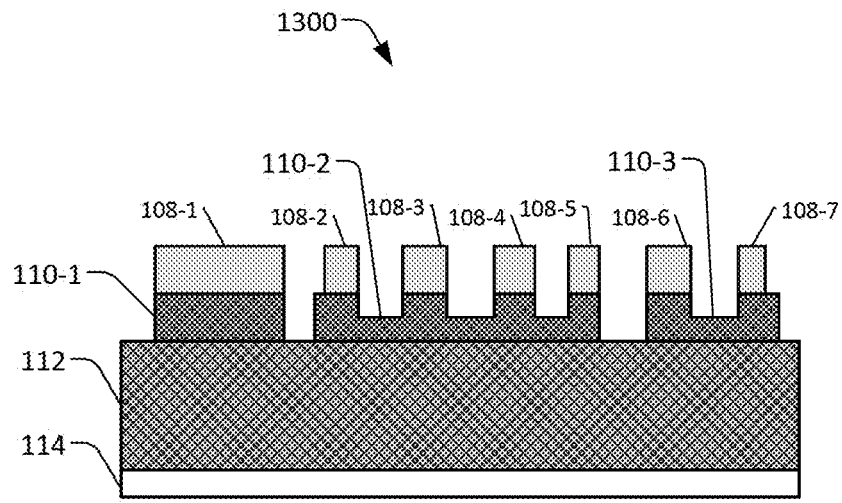
FIG. 13 is a diagram illustrating an example cross section of a structure of a hardmask-1 (HM1) etch process.

FIG. 13 is a cross section of a structure 1300 using dry etching technique, the partially etched HM1 110 is now fully etched and lands on the ILD 112. The resulting pattern in the HM1 layer 110 may be etched, partially etched, or not etched segments.

Figure 14:
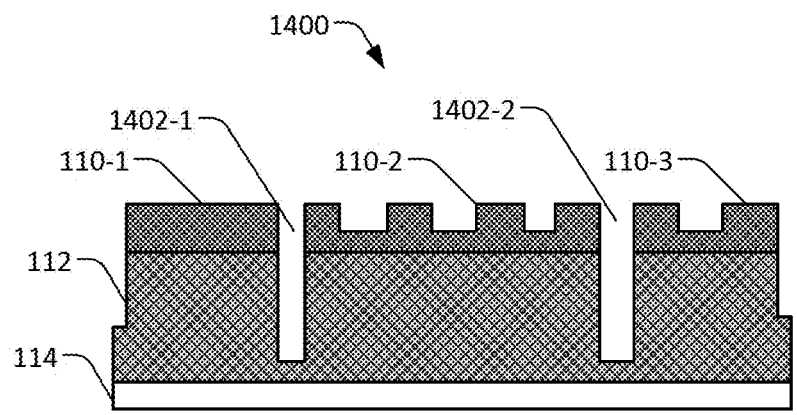
FIG. 14 is a diagram illustrating an example cross section of a structure of an interlayer dielectric (ILD) etch process.

FIG. 14 is a cross section of a structure 1400 using dry etching technique, and the HM1 110 layer acts as hard mask, an etch is made into the ILD layer 112 to create air gaps 1402. The HM2 layer 108 is consumed during this etch process.

Figure 15:
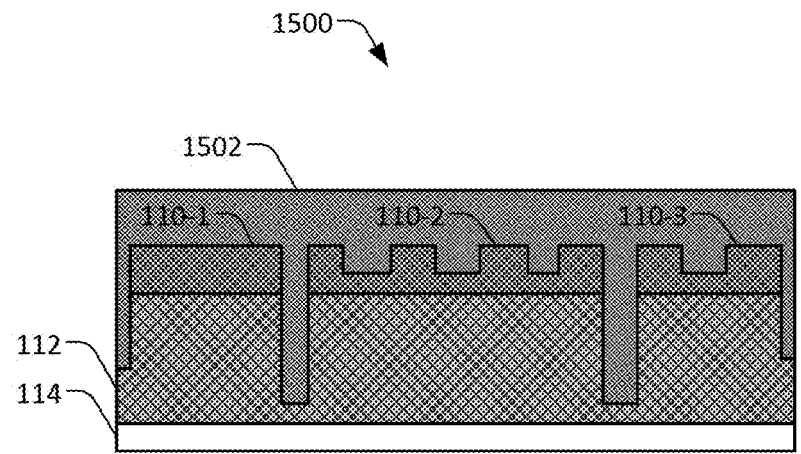
FIG. 15 is a diagram illustrating an example cross section of a structure of a backfill-material deposition process.

FIG. 15 is a cross section of a structure 1500 using CVD, ALD or spin coating deposition process. In particular, a material 1502 which is ILD compatible and removable material (e.g., CHM) may be used to backfill the air gaps 1402 refer to FIG. 14.

Figure 16:
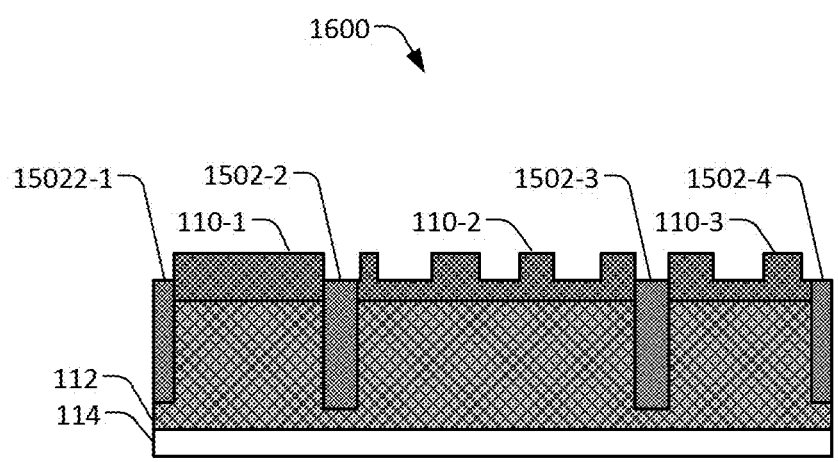
FIG. 16 is a diagram illustrating an example cross section of a structure of an etch back process.

FIG. 16 is a cross section of a structure 1600 using dry etching technique, the material 1502 is etched.

Figure 17:
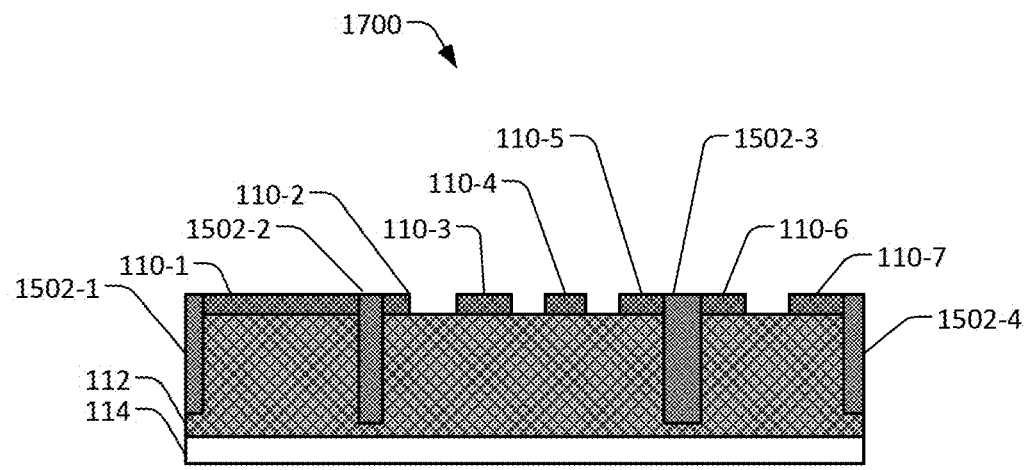
FIG. 17 is a diagram illustrating an example cross section of a structure of a hardmask-1 (HM1) etch process.

FIG. 17 is a cross section of a structure 1700 using dry etching technique, the HM1 110 is then etched for the third time to define the trenches that will be metalized.

Figure 18:
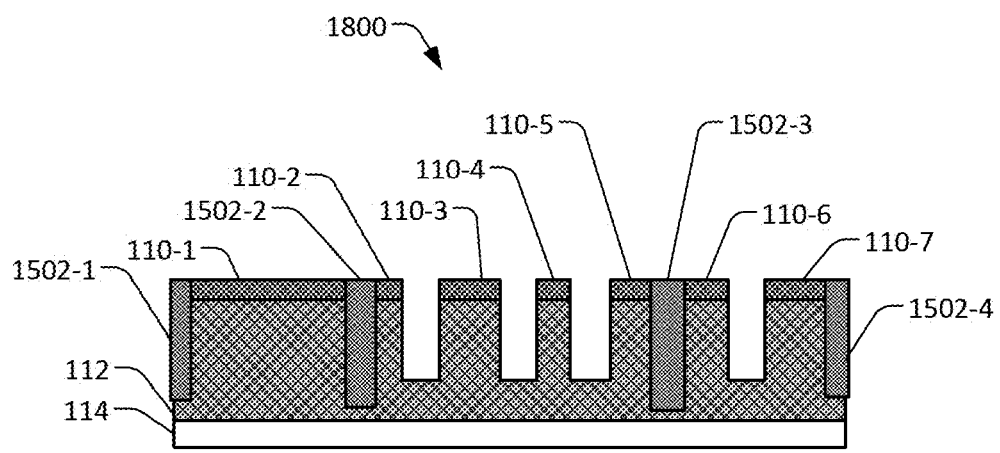
FIG. 18 is a diagram illustrating an example cross section of a structure of an interlayer dielectric (ILD) etch process.

FIG. 18 is a cross section of a structure 1800 using dry etching technique, ILD Layer 112 does a full trench etch. A full vertical interconnect access (VIA) patterning (not shown) can happen between the process of etching of the ILD and metallization which can be implemented without affecting the air gaps.

Figure 19:
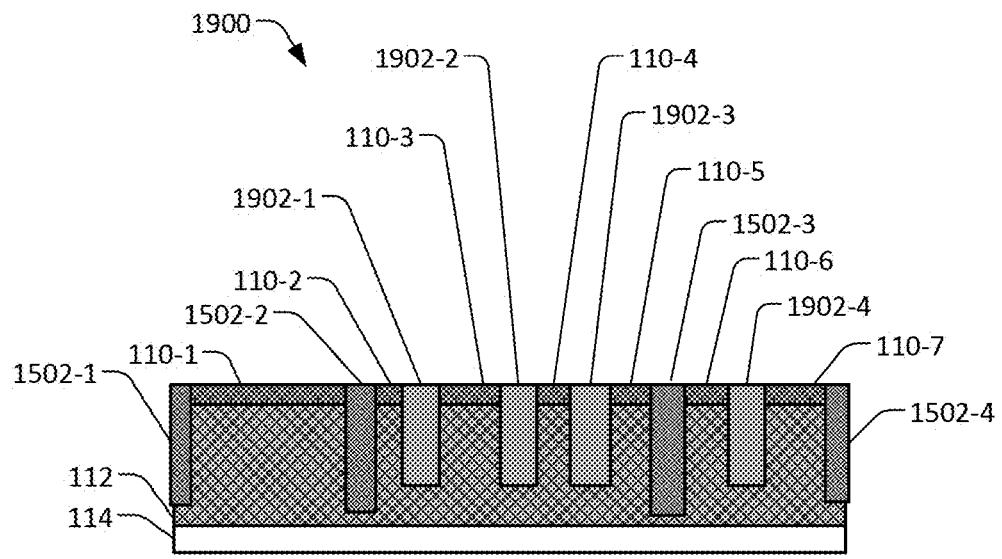
FIG. 19 is a diagram illustrating an example cross section of a structure of a metallization process.

FIG. 19 is a cross section of a structure 1900 of a metallization process. Metal such as copper, is introduced into trenches 1902 using any suitable deposition technique.

Figure 20:
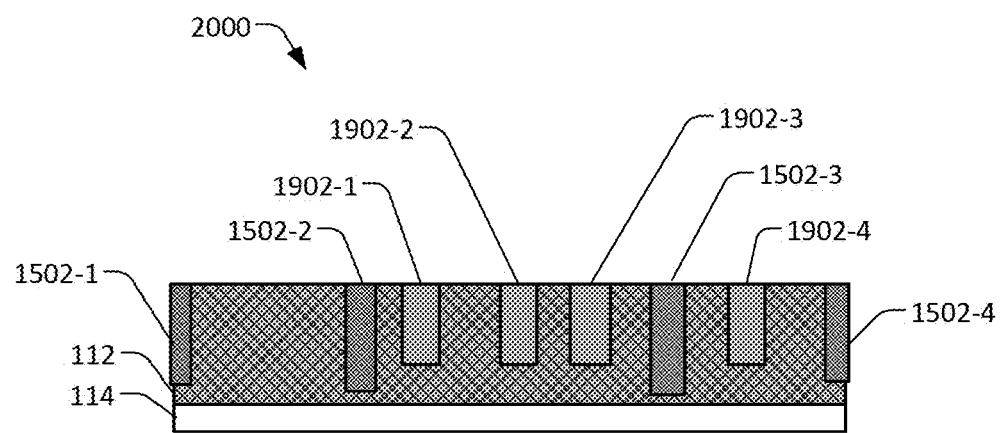
FIG. 20 is a diagram illustrating an example cross section of a structure of a chemical mechanical planarization/polishing (CMP) process.

FIG. 20 is a cross section of a structure 2000 using a chemical mechanical planarization/polishing (CMP) process. In particular, the HM1 110 is polished by the CMP process.

Figure 21:
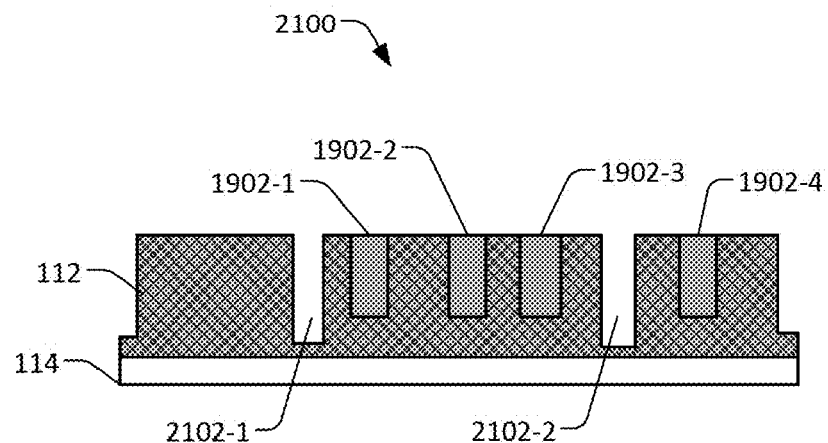
FIG. 21 is a diagram illustrating an example cross section of a structure of a backfill-material removal process.

FIG. 21 is a cross section of a structure 2100 using an etch/ash process. In particular, the etch/ash process removes the backfill material 1502 that filled the air-gaps. In certain implementations, an ILD 112 compatible etch/ash may be used. Air gaps 2102 are now produced after removing the backfill material 1502.

Figure 22:
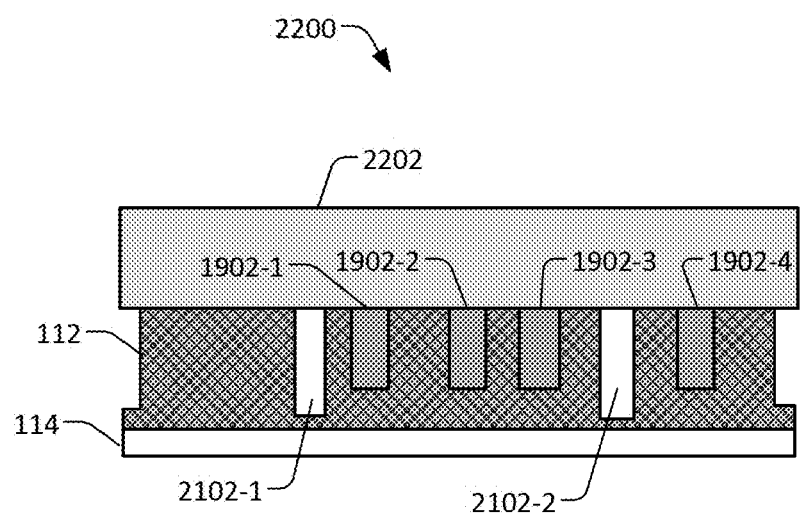
FIG. 22 is a diagram illustrating an example cross section of a structure of next layer interlayer dielectric (ILD) process.

FIG. 22 is a cross section of a structure 2200 structure of next layer interlayer dielectric (ILD) deposition process. In particular, another ILD layer 2202 may be added. The ILD layer 2202 may be considered the next layer in the process.

Figure 23:
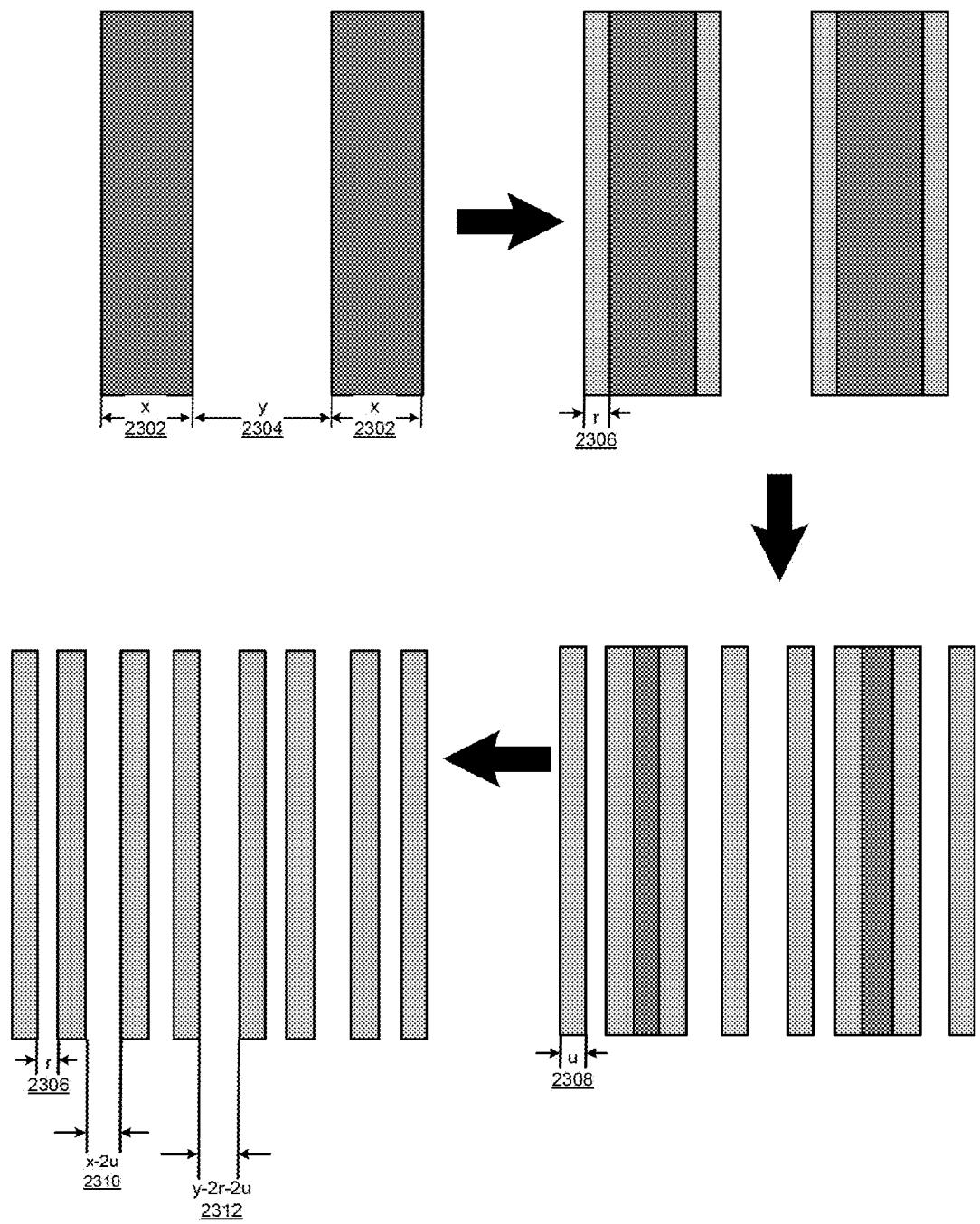
FIG. 23 is a diagram illustrating an example flow chart with example pitch quartering values to create air gaps between trenches.

FIG. 23 shows an example of quartering values to create air gaps between trenches. In particular, FIG. 23 shows an example and example values for pitch quartering (PQ)=pitch halved trenches (PH)+air gaps (AG), with example final values for the wire trenches and air gaps.

The values B, C, and D represent wires, wire trenches, or air gap width. The B trench is from a first backbone (BB1). The C trench is a complimentary trench between the backbones. The D trench is from a second backbone (BB2). The D trench may serve as an air gap. With pitch quartering, specific values may be realized, as shown in this example.

In this example, a 25 nm wide air gap is created between 17 nm wide trenches. The resulting values may be determined by defining or controlling a starting backbone width of "x" 2302, a backbone spacing of "y" 2304, a spacer thickness "r" 2306, and a second spacer thickness "u" 2308.

A constraint is x+y=4*pitch. The final trenches are defined as B=x−2u (identified as element 2310 in FIG. 23), C=y−2r−2u (identified as 2312 in FIG. 23). D=r, and as defined D is the air gap width.

If D is an air gap with a value of 25 nm, B is 17 nm and C is 17 nm. Then using the defined equations above, u=13 nm, x=43 nm, and y=93 nm.

Figure 24:
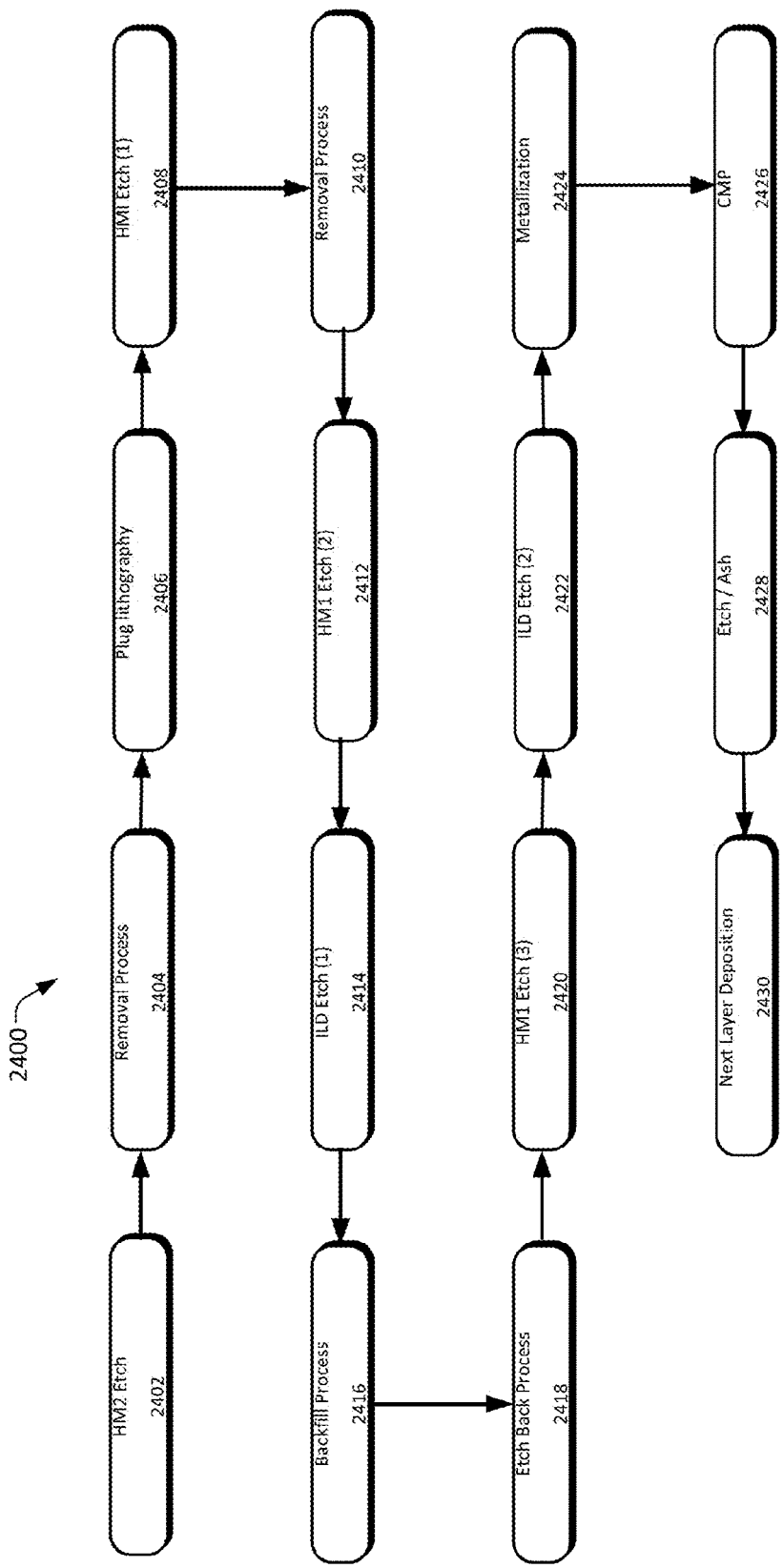
FIG. 24 is a block diagram of pitch quartering to create pitch halved trenches and pitch halved air gaps.

FIG. 24 shows block diagram 2400 of pitch quartering to create pitch halved trenches and pitch halved air gaps. The embodiment of this invention starts after etching of spacer-1.

At block 2402, BB2 material is used as hard mask while etching into HM2 material.

At block 2404, BB2 material is removed using dry etch or ash process.

At block 2406, a pattern, ARC, and CHM material are introduced. Plug lithography is used to determine which trenches becomes air gap.

At block 2408, using dry etching technique, HM1 layer is etched partially with subsequent HM2 layer etched.

At block 2410, using wet cleanse process, removes all plug lithography pattern and spacer-2 material but leaves in place the HM2 and HM1 layer.

At block 2412, using dry etching technique, the partially etched HM1 is now fully etched and lands on the ILD layer.

At block 2414, using dry etching technique, and the HM1 layer acts as hard mask, an etch is made into the ILD layer to create air gaps. The HM2 layer is consumed during this etch process.

At block 2416, using CVD, ALD or spin coating process, a material which is ILD compatible and removable (e.g., CHM) may be used to backfill the air gaps.

At block 2418, using dry etching technique, the material (e.g., CHM) is etched.

At block 2420, using dry etching technique, the HM1 is then etched for the third time to define the trenches that will be metalized.

At block 2422, using dry etching technique, ILD Layer does a full trench etch to create wire trenches. A full vertical interconnect access (VIA) patterning can happen between the process of etching of the ILD and metallization which can be implemented without affecting the air gaps.

At block 2424, metal such as copper, is introduced into the wire trenches, using any suitable deposition technique for metallization.

At block 2426, using chemical mechanical polishing, HM1 layer is polished.

At block 2428, using an etch/ash process to remove the backfill material that filled the air-gaps. In certain implementations, an ILD compatible etch/ash may be used. Air gaps are now produced after removing the backfill material.

At block 2430, using CVD technique, an ILD layer is deposited to form as the next layer for the next metallization.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, and operations are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A silicon structure comprising:
   a plurality of wire trenches;
   one or more air gaps that occupy one or more of wire trenches;
   metallized wires that are created by filling wire trenches not used for air gaps, wherein a number of the extra created trenches are left unfilled; and
   a backbone trench profile defined by a lithography process, wherein a conformal spacer is deposited to create additional trenches between existing trenching, doubling number of trenches.

2. The silicon structure of claim 1, wherein the air gaps are created by pitch division of an order higher needed for a design to create a desired first pitch, and wherein a second pitch is approximately half the size of the first pitch and a third pitch is approximately a quarter the size of the first pitch.

3. The silicon structure of claim 1, wherein one or more interlayer dielectric (ILD) structures form an ILD/AG/ILD layer arrangement implementing an interconnect pattern of pitch metal trenches.

4. The silicon structure of claim 1, wherein a metal such as copper is introduced into the trenches not used for air gaps.

5. A method of creating air gaps in silicon structure comprising:
   defining the air gaps and wire trenches in a pattern;
   creating the wire trenches; and
   implementing one or more of the wire trenches as air gaps;
   wherein a lithography process is used to define a backbone trench profile, a conformal spacer is deposited to create additional trenches between existing trenches, doubling number of trenches.

6. The method of claim 5, wherein plug lithography defines which trenches becomes air gaps.

7. The method of claim 5, further comprising creating the wire trenches on the pattern, wherein a hard mask 1 (HM1) layer is etched partially with a subsequent hard mask 2 (HM2) layer etch.

8. The method of claim 7, wherein a hard mask 1 (HM1) material is a titanium nitride (TiN) and a hard mask 2 (HM2) is a silicon nitride (SiN).

9. The method of claim 7, wherein a wet cleanse process is used to remove plug lithography pattern and conformal spacer material and leaving the hard mask 1 (HM1) layer and hard mask 2 (HM2) layer.

10. The method of claim 7, wherein a dry etch technique is used to partially etch the hard mask 1 (HM1) on an interlayer dielectric (ILD) wherein a resulting pattern may be etched, partially etched, or not etched.

11. The method of claim 7, wherein using dry etching the hard mask 1 (HM1) layer acts as a hard mask, and an etch is made into a interlayer dielectric (ILD) to create air gaps, wherein the hard mask 2 (HM2) layer is consumed during the dry etching.

12. The method of claim 7, wherein using a deposition technique, a material such as a carbon hard mask (CHM) which is interlayer dielectric (ILD) compatible and removable is used as backfill material for the air gaps.

13. The method of claim 12, wherein using dry etching the carbon hard mask (CHM) is etched.

14. The method of claim 7, wherein using dry etching the hard mask 1 (HM1) is etched for a third time to define trenches to be metallized.

15. The method of claim 7, wherein using dry etching, a full trench etch is performed on the interlayer dielectric (ILD) layer to create wire trenches.

16. The method of claim 7, wherein using a deposition technique, metal such as copper is deposited into the wire trenches.

17. The method of claim 7, wherein a using chemical mechanical polishing (CMP) the hard mask 1 (HM1) is polished.

18. The method of claim 7, wherein using a dry etch/ash process removes the backfill material to implement the trenches as air gaps.

19. A method of pitch quartering in a silicon structure comprising:

performing a lithography process on a first backbone structure of the silicone structure;
  performing a spacer deposition process on the first backbone structure;
  dry etching on the first backbone structure to create sidewall spacers;
  dry etching to transfer a wire pattern to a second backbone structure of the silicon structure;
  wet cleansing to remove any remaining spacer material of the silicon structure;
  performing a spacer 2 deposition on the silicon structure;
  dry etching to create sidewall spacers;
  dry etching into a hardmask material of the silicon structure, wherein a second backbone structure is used as a mask;
  etching material from the second backbone structure;
  applying a plug lithography to define wire lines and/or air gaps in the silicon structure;
  wet cleansing to remove plug lithography and spacer 2 material;
  drying etching on a first hardmask of the silicon structure;
  drying etching to remove a second hardmask of the silicon structure;
  spin coating deposition to fill air gaps of the silicon structure;
  drying etching process to define trenches to be metalized;
  metallizing for the trenches that are to be metalized;
  mechanical planarization/polishing (CMP) on the silicon structure; and
  etching to remove backfill material in the air gaps.

* * * * *